(12) United States Patent
Serban

(10) Patent No.: US 6,349,837 B1
(45) Date of Patent: Feb. 26, 2002

(54) STIFFENED RELAY RACK

(75) Inventor: Vasile Serban, Rocky River, OH (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/709,843

(22) Filed: Nov. 10, 2000

Related U.S. Application Data

(60) Provisional application No. 60/164,697, filed on Nov. 10, 1999.

(51) Int. Cl.[7] .................................................. A47F 5/00
(52) U.S. Cl. ...................... 211/26; 211/189; 312/265.4; 361/829; 52/167.1
(58) Field of Search ...................... 211/26, 189, 206; 312/265.1, 265.4; 361/829; 52/167.1

(56) References Cited

U.S. PATENT DOCUMENTS

| | | | | |
|---|---|---|---|---|
| 4,493,422 A | * | 1/1985 | Kaegebein | 211/26 |
| 4,497,411 A | | 2/1985 | DeBortoli | |
| 4,519,013 A | * | 5/1985 | Breeze et al. | 211/26 X |
| 4,715,502 A | | 12/1987 | Salmon | |
| 5,004,107 A | * | 4/1991 | Sevier | 211/26 |
| 5,233,129 A | * | 8/1993 | Hall | |
| 5,284,254 A | * | 2/1994 | Rinderer | 211/26 |
| 5,566,836 A | | 10/1996 | Lerman | |
| 5,788,087 A | * | 8/1998 | Orlando | 211/26 |
| 5,819,956 A | * | 10/1998 | Rinderer | 211/26 |
| 5,867,372 A | * | 2/1999 | Shie | 361/829 X |
| 5,934,485 A | * | 8/1999 | Harris et al. | 211/26 |
| 5,975,315 A | * | 11/1999 | Jordan | 211/26 |
| 5,983,590 A | * | 11/1999 | Serban | 211/26 X |
| 6,006,925 A | * | 12/1999 | Sevier | 211/26 |
| 6,179,133 B1 | * | 1/2001 | Reece | 211/26 |
| D438,177 S | * | 2/2001 | Rogers | |
| 6,202,570 B1 | * | 3/2001 | Kurtsman | |
| 6,220,456 B1 | * | 4/2001 | Jensen et al. | 211/26 |
| 6,223,909 B1 | * | 5/2001 | Mendoza | 211/26 |

* cited by examiner

Primary Examiner—Robert W. Gibson, Jr.
(74) Attorney, Agent, or Firm—Jones, Day, Reavis & Pogue

(57) ABSTRACT

A relay rack includes a base, a pair of uprights, support gussets and a crossbar. The base is anchored to the ground. The uprights extend from the base to the crossbar. Support gussets stiffen the base and the uprights. The uprights and crossbar are formed such that any mechanical vibrations transmitted through the rack are continuously distributed through the rack members. The base is further stiffened by including a central member that stiffens the rack from deforming in the plane of the uprights.

12 Claims, 4 Drawing Sheets

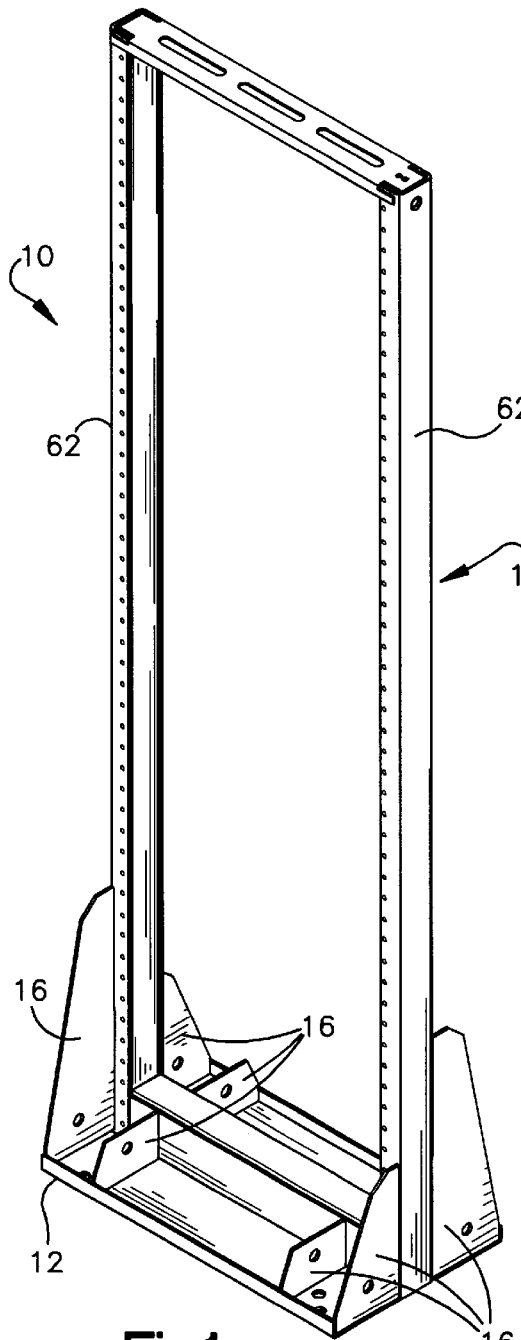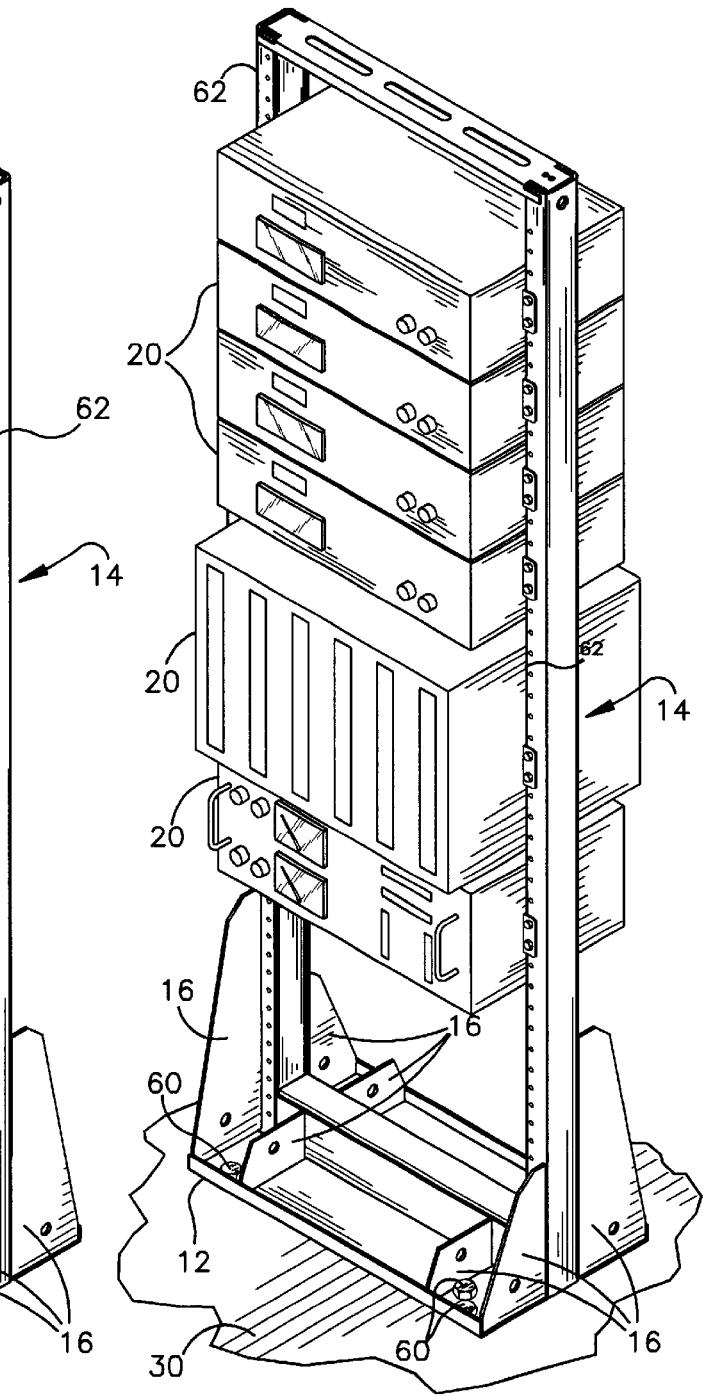
Fig.1
Fig.2

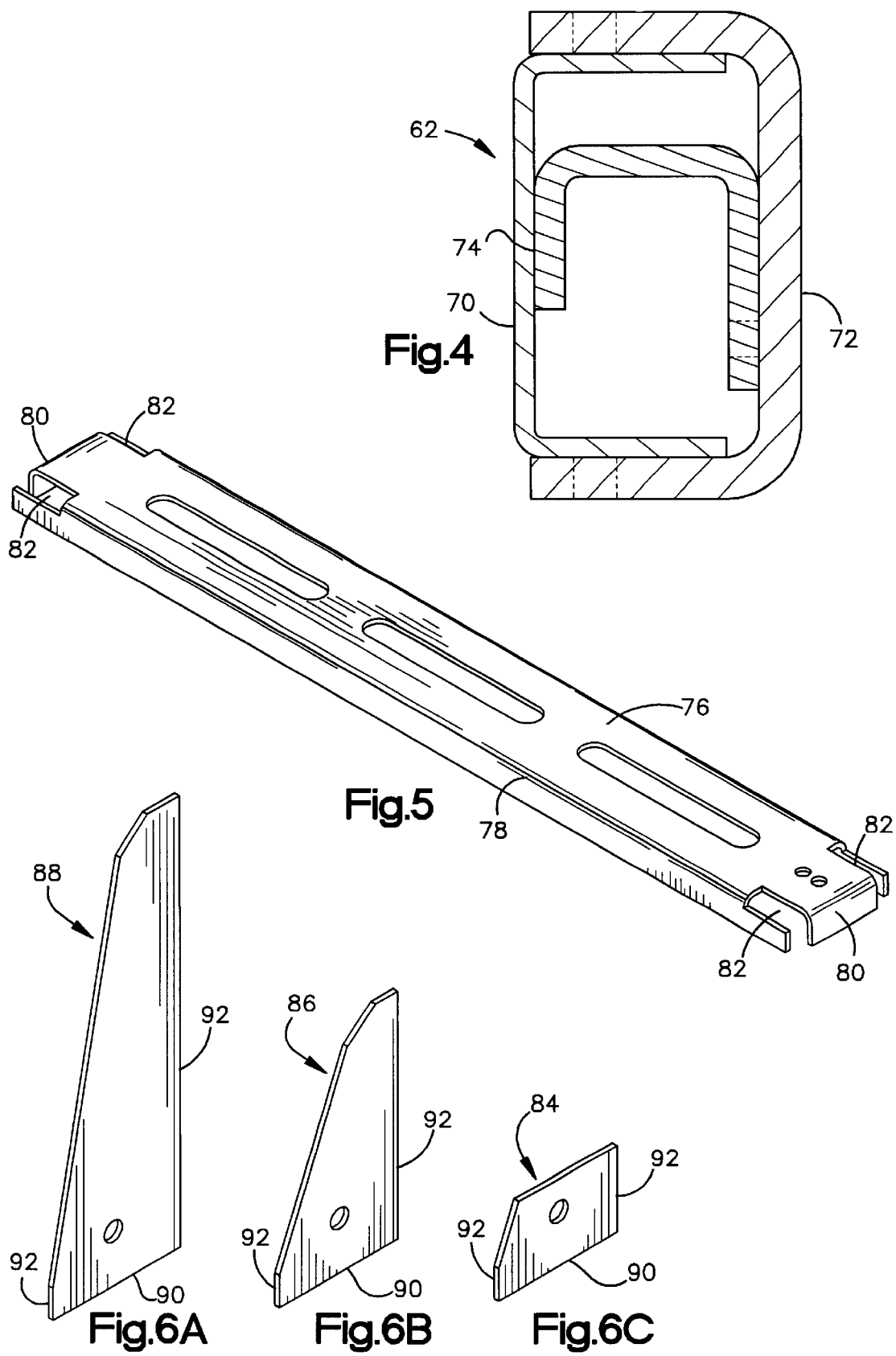

STIFFENED RELAY RACK

CROSS REFERENCES TO RELATED APPLICATIONS

This application claims priority from the following application:

U.S. application Ser. No.: 60/164,697 filed Nov. 10, 1999.

FIELD OF THE INVENTION

The present invention relates to relay racks for supporting electrical components.

BACKGROUND OF THE INVENTION

Relay racks are used to support electrical equipment above a floor surface. Electrical equipment can be vertically stacked within the rack and supported by the rack. This reduces the required floor space for the electrical equipment. Also, the supported electrical equipment is elevated above the floor surface and thus more accessible to technicians in charge of maintaining the equipment.

A relay rack typically includes a base, two uprights that project upward from the base, and a cross bar that joins the uprights. Electrical equipment is mounted on and between the uprights and below the crossbar.

SUMMARY OF THE INVENTION

The present invention provides a relay rack for supporting electrical equipment comprising a base structure and a pair of upright supports. The base structure is configured to be anchored to a floor and has a front portion, a back portion, and opposite ends. The front and back portions of the base have a horizontal floor plate and a vertical wall. The pair of upright supports adjoins and extends vertically upward from the opposite ends of the base and support the electrical equipment mounted on and between the uprights.

One aspect of the present invention provides the relay rack with support gussets. The support gussets include first support gussets that span the horizontal floor plate and the vertical wall and second support gussets that span the horizontal plate and the upright supports.

Another aspect of the present invention relates to the support gussets. In accordance with this aspect, the support gussets include a pair of large gussets which span one of the horizontal floor plates and one of the upright supports. The support gussets also include a pair of medium gussets which span one of the horizontal floor plates and one of the upright supports.

Another aspect of the present invention provides the relay rack with a horizontally elongated stiffener interconnecting the upper ends of the vertical walls.

Yet another aspect of the present invention provides the relay rack wherein the uprights include a first channel, a second channel, and a third channel. Each of the channels has a central portion and two flanges perpendicular to the central portion. The first and third channels face oppositely to define the periphery of the upright supports. The second channel is received between the first and third channels and spans the central portions of the first and third channels.

BRIEF DESCRIPTION OF THE DRAWINGS

FIG. 1 is an isometric view of a relay rack comprising a preferred embodiment of the present invention;

FIG. 2 is an isometric view similar to FIG. 1 showing a relay rack supporting electrical equipment;

FIG. 4 is a cross sectional view of an upright of the relay rack shown in FIG. 1;

FIG. 5 is an isometric view of a crossbar of the relay rack shown in FIG. 1;

FIGS. 6A, 6B, 6C are views of a set of gussets of the relay rack of FIG. 1; and

DESCRIPTION OF A PREFERRED EMBODIMENT

Figure 3A:
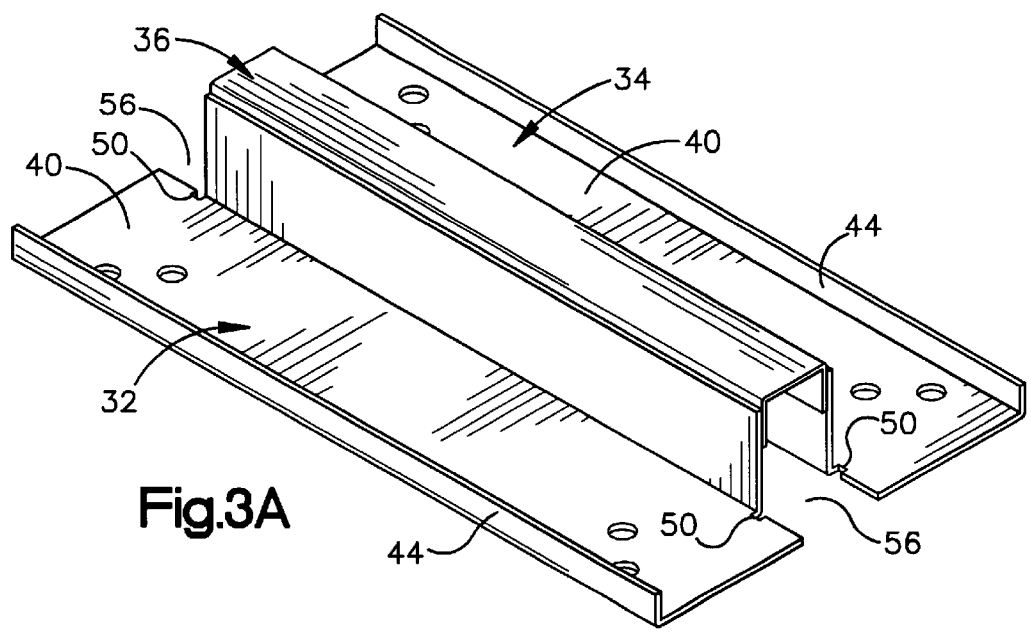
FIG. 3A is an isometric view of the base of the relay rack shown in FIG. 1.

The present invention is a relay rack 10 for supporting electrical equipment for use in telecommunications, as shown in FIG. 1. The rack includes a base 12, an upright frame 14, and support gussets 16. The base 12 is welded to the upright frame 14. The support gussets 16 stiffen the base 12 and stiffen the upright frame 14. Electrical equipment 20 (FIG. 2) can be supported within the upright frame 14 when the base 12 is rigidly anchored to a concrete floor 30. In accordance with the invention, the relay rack 10 is constructed to withstand zone 4 earthquakes to prevent damage to the equipment 20 and prevent interruption of equipment operation.

Figure 3B:
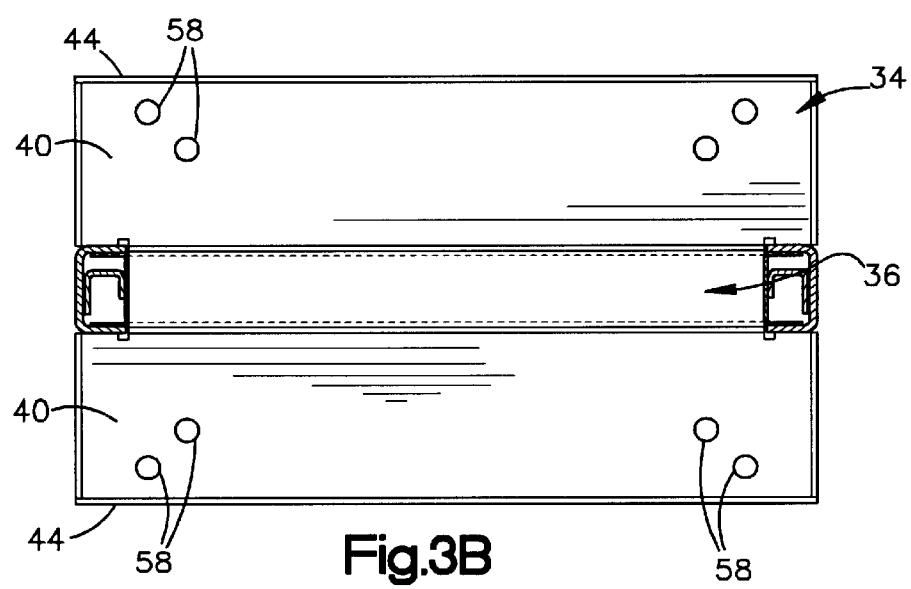
FIG. 3B is an overhead view of the base of FIG. 3A.
Figure 3C:
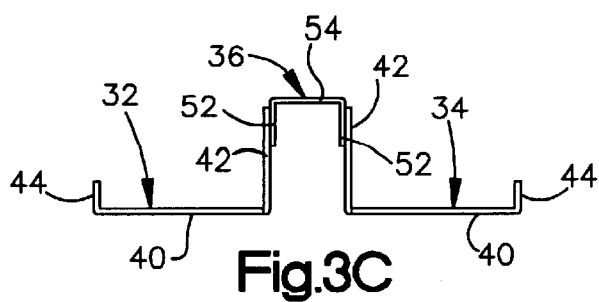
FIG. 3C is an end view of the base of FIG. 3A.

Turning now to FIGS. 3A, 3B, and 3C, the base 12 includes a forward plate 32, a rearward plate 34, and a C-channel 36. The forward and rearward plates 32 and 34 each have a horizontal portion 40, a vertical portion 42 and a lip 44. The horizontal portion 40 is rectangular with two small notches 50 on one of the long edges. The vertical portion 42 projects upward from the long edge of the horizontal portion 40 between the two small notches 50. The vertical portion 42 is thus shorter than the long edge of the horizontal portion 40. The lip 44 is a vertical flange that extends upward from the long side of the horizontal portion 40 opposite the vertical portion 42.

The C-channel 36 has two flanges 52 and a central portion 54. The flanges 52 are perpendicular to the central portion 54. Each flange 52 of the C-channel 36 is welded to one of the vertical portions 42 of the forward and rearward plates 32 and 34. A series of fillet welds (not shown) along the length of the C-channel 36 join the C-channel 36 to the forward and rearward plates 32 and 34. The central portion 54 of the C-channel 36 is elevated above the plates 32 and 34. The C-channel 36 is the same length as the vertical portion 42 of the forward and rearward plates 32 and 34, and is not as long as the horizontal portion 40. A pair of cutouts 56 at opposite ends of the C-channel 36 are formed to receive the upright frame 14. The forward and rearward plates 32 and 34 are each further configured with four holes 58. The four holes 58 are arranged in two pairs located at opposite ends of the horizontal portion 40. When the relay rack 10 is being installed, the holes 58 receive seismic anchors 60 (FIG. 2) that bolt the relay rack 10 to the ground 30. The holes are spaced nearer the outside edges of the relay rack 10 to provide a more stable base for the upright frame 14.

The base 12 has a small footprint. The small footprint minimizes the floor space required to install the rack 10 in a building. The cutouts 56, which receive the upright frame 14, are positioned within the small footprint of the base. Furthermore, the cutouts 56 are notched so that the upright frame 14 abuts the base 12 along edge surfaces of the C-channel 36, the vertical portion 42 of the forward and rearward plates 32 and 34, and the gussets 16. The upright frame 14 can then be attached to the base 12 along those surfaces.

Turning back to FIG. 1, the upright frame 14 is a U-shaped structure that includes two uprights 62 and a cross bar 64. Each upright 62 is received closely and tightly within the cutouts 56 with the lower edge of the upright 62 resting on the floor surface 30. The cross bar 64 at the top of the frame 14 connects the two uprights 62.

The uprights 62 are alike. As shown in FIG. 4, each upright 62 includes three channel pieces: a small C-channel 70, a large C-channel 72, and a J-channel 74. The J-channel 74 is placed within the flanges of the large C-channel 72, with the larger flange of the J-channel resting on the central portion of the large C-channel 72. A slot weld (not shown) is used to connect the J-channel 74 to the large C-channel 72 along the length of both channels 72 and 74. The small C-channel 70 is reversed relative to the large C-channel 72 and is placed onto the joined J- and large C-channels 74 and 72 so that the central portion of the small C-channel 70 adjoins the small flange of the J-channel 74, and the flanges of the small C-channel 70 abut the inner surface of the flanges of the large C-channel 72. The small C-channel 70 is spot welded to the J-channel 74. Two fillet welds (not shown) at the ends of the flanges of the large C-channel 72 fix the large C-channel 72 to the small C-channel 70 and enclose the J-channel 74 within the periphery of the C-channels 70 and 72.

Along the length of each upright 62, holes are drilled through the flanges of the large and small C-channels 70 and 72. These holes receive fasteners from the electrical equipment 30 to attach the equipment 30 to the upright 14. At the upper end of the uprights 62, the small C-channel 70 and the J-channel 74 are foreshortened to define a recess at the upper ends of the upright in which the ends of the crossbar 64 can attach to the uprights 62.

The cross sectional configuration of the upright 62 distributes dynamic loads across the three channel pieces 70–74. The internal J-channel 74 acts across the two C-channel members 70 and 72 to keep the upright from bowing. If a load is directed along the central portions of the C-channels 70 and 72, the J-channel 74 maintains the shape of the C-channels 70 and 72 by exerting a restorative force between the C-channels 70 and 72.

The cross bar 64, as shown in FIG. 5, joins the two upper ends of the uprights 62. The cross bar 64 is a modified C-channel. The C-channel has a central portion 76 and a pair of flanges 78 extending perpendicularly from the central portion 76. A pair of lips 80 at opposite ends of the channel extend perpendicularly from the central portion 76 of the cross bar 64. Each lip 80 is also perpendicular to the flanges 78 of the cross bar 64. Two short, open slots 82 at each end of the cross bar 64 separate the central portion 76 from the flanges 78. The slots 82 receive the flanges of the large C-channel 72. The lips 80 on the ends of the cross bar 64 abut the inside of the central portion of each large C-channel 72 of the upright 62. The lip 80 of the cross bar 64 is slot welded to each of the uprights 62.

As indicated in FIGS. 1 and 2, the cross bar 64 and uprights 62 form a continuous load bearing structure that can withstand the dynamic load applied during seismic motion. Similar to the cutouts 56 of the base, the foreshortened small C-channel 70 and the J-channel 72 create a recess in which the cross bar 64 can then be attached to the uprights 62 along abutting surfaces between the lips 80 and flanges of the cross bar 64.

Turning now to FIG. 6, the support gussets include small, mid-size and large gussets 84, 86, and 88. Each gusset includes a horizontal edge 90. Each gusset 84-88 also has a pair of vertical edges 92. The horizontal edge length for each of the gussets is the same as the length of the horizontal portion 40 of the forward and rearward plates 32 and 34. The four small gussets 84 are located on the base 12 between the two notches 50 on the horizontal portion 40 of the forward and rearward plate 32 and 34. The horizontal edge 90 of each small gusset 84 is welded to the horizontal portion 40 of the base plates 32 and 34. The vertical edges 92 are welded to the lip 44 and vertical wall 42 of either the forward or rearward plate 32 or 34.

The mid-size and large gussets 86 and 88 are located between the base 12 and the uprights 62 at opposite ends of the base 12. The horizontal edge 90 of each of the mid-size and large gussets 86 and 88 is welded onto the horizontal portion 40 of the base 12. The shorter vertical edges 92 are welded to the lip 44 of the plates 32 and 34 and the larger vertical edges 92 are welded to the uprights 62. The mid-size and large gussets 86 and 88 are positioned so that each end of the base 12 has a mid-size gusset 86 and a large gusset 88 on opposite sides of the upright frame 14. Furthermore, the forward and rearward base plates 32 and 34 each have a mid-size gusset 86 at one end and a large gusset 88 at the opposite end. This configuration of differently sized gussets adds clearance for electrical equipment 20.

The varying height of the gussets 84–88 distributes a dynamic load more evenly along the uprights 62. If the support gussets were the same size, then the difference in strength along the upright would drastically change at the top of the equally sized gussets. By using differently sized gussets 86 and 88, however, the relative strength between adjacent heights of the uprights tapers off between the medium and large gussets 86 and 88.

The base 12 is placed over the concrete floor 30 in the desired position. Eight holes drilled into the concrete floor 30 match the position of the holes on the base plates 32 and 34. Anchors inserted into the drilled holes are used to rigidly attach the base to the concrete floor 30 using bolts that are received in the anchors. The anchors and bolts may comprise any suitable structure known in the prior art.

Figure 7:
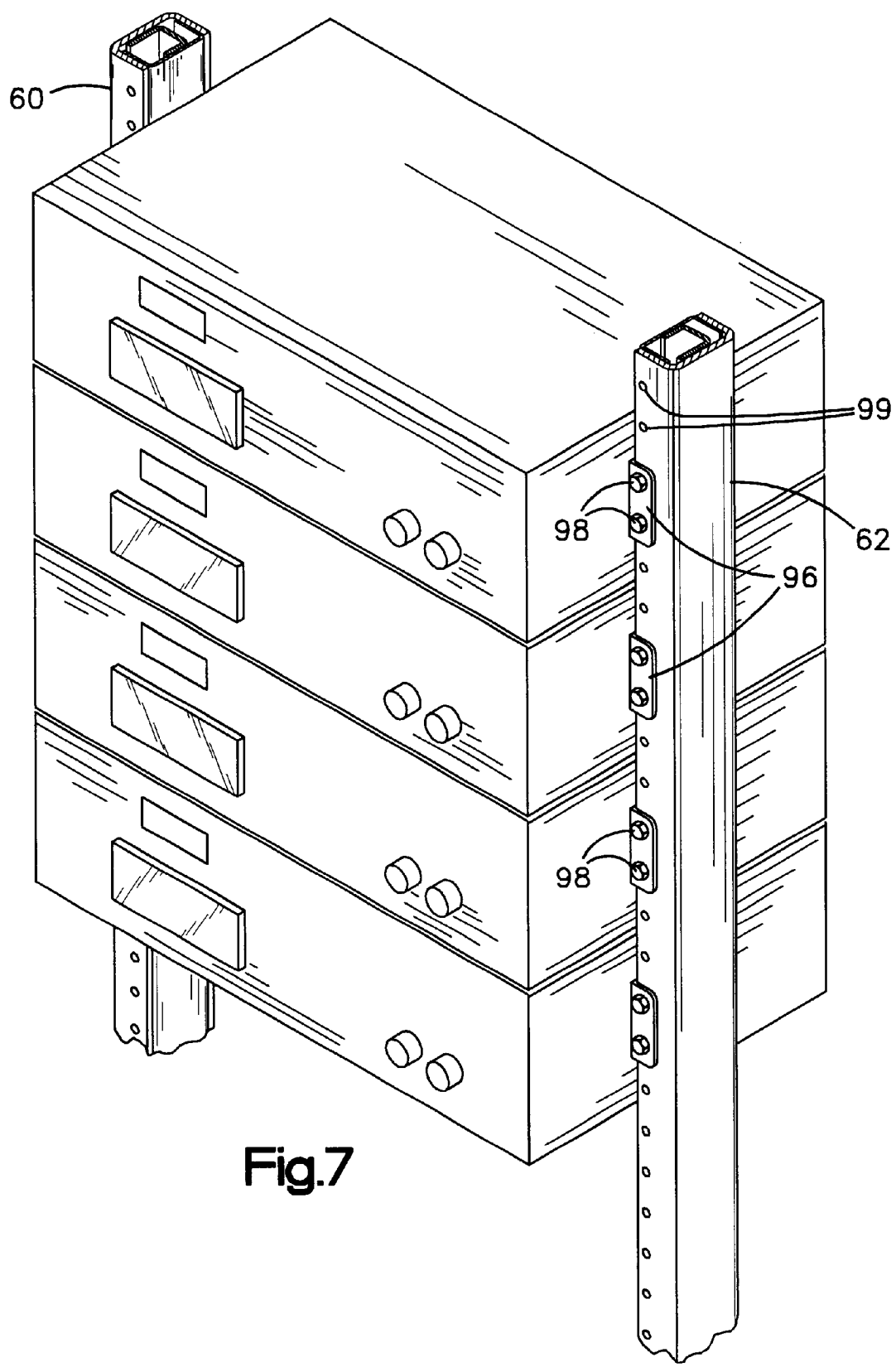
FIG. 7 is a partial view of the relay rack of FIG. 2.

Electrical equipment 20 (FIG. 7) is attached to the uprights 62 by fasteners 96. The fasteners 96 extend from opposite sides of the electrical equipment 20. Each fastener 96 receives two bolts. The bolts extend through holes 97 on the uprights 62. Each pair of bolts fixes the electrical equipment 20 to one upright 62. Once both fasteners 96 for a single piece of electrical equipment 20 are attached to the uprights 62, the electrical equipment 20 is fixed to the relay rack 10. The stiffened properties of the relay rack thus protect the electrical equipment 20 from damage or service interruption that could be caused by movement of the ground 30.

The invention has been described with reference to preferred embodiments. Those skilled in the art will perceive improvements, changes and modifications. Such improvements, changes and modifications are intended to be covered by the appended claims.

The following is claimed:

1. A relay rack for supporting electrical equipment, said relay rack comprising:
   a base structure configured to be anchored to a floor, said base structure having a front portion, a back portion, and opposite ends with each of said front and back portions of said base structure having a horizontal floor plate and a vertical wall;

a pair of upright supports adjoining and extending vertically upward from said opposite ends of said base structure, said upright supports being configured to support said electrical equipment mounted on and between said uprights; and support gussets including first support gussets that span said horizontal floor plate and said vertical wall and second support gussets that span said horizontal plate and said upright supports.

2. The relay rack as defined in claim 1 wherein said base further comprises a horizontally elongated stiffener interconnecting the upper ends of said vertical walls.

3. The relay rack as defined in claim 2 wherein said horizontal stiffener has opposite ends abutting said vertical supports.

4. The relay rack as defined in claim 1 wherein said upright supports comprise a first channel, a second channel, and a third channel, each of said channels having a central portion and two flanges perpendicular to said central portion with said first and third channels face oppositely to define the periphery of said upright supports, and with said second channel being received between said first and third channels and spanning said central portion of said first and third channels.

5. The relay rack as defined in claim 1 wherein said first support gussets include a pair of small gussets, said second support gussets include a pair of large gussets and a pair of medium gussets.

6. A relay rack for supporting electrical equipment, said relay rack comprising:

a base structure configured to be anchored to a floor, said base structure having a front portion, a back portion, and opposite ends with each of said front and back portions of said base structure having a horizontal floor plate and a vertical wall;

a pair of upright supports adjoining and extending vertically upward from said opposite ends of said base structure, said upright supports being configured to support said electrical equipment mounted on and between said uprights; and support gussets including a first pair of gussets each spanning one of said horizontal floor plates and one of said upright supports, and a second pair of gussets each spanning one of said horizontal floor plates and one of said upright supports, said first pair of gussets having a height greater than said second pair of gussets.

7. The relay rack as defined in claim 6 wherein said support gussets further include a pair of small gussets spanning one of said horizontal floor plates and the adjacent said vertical wall.

8. A relay rack for supporting electrical equipment, said relay rack comprising:

a base structure configured to be anchored to a floor, said base structure having a front portion, a back portion, and opposite ends, each of said front and back portions of said base structure having a horizontal floor plate and a vertical wall;

a pair of upright supports adjoining and extending vertically upward from said opposite ends of said base structure, said upright supports being configured to support said electrical equipment mounted on and between said uprights; and a horizontally elongated stiffener interconnecting the upper ends of said vertical walls.

9. The relay rack as defined in claim 8 wherein said horizontal stiffener has opposite ends abutting said vertical supports.

10. A relay rack for supporting electrical equipment, said relay rack comprising:

a base structure configured to be anchored to a floor, said base structure having a front portion, a back portion, and opposite ends, each of said front and back portions of said base having a horizontal floor plate and a vertical wall; and a pair of upright supports adjoining and extending vertically upward from said opposite ends of said base, said upright supports being configured to support said electrical equipment mounted on and between said uprights;

said upright supports comprising a first channel, a second channel, and a third channel, each of said channels having a central portion and two flanges perpendicular to said central portion with said first and third channels face oppositely to define the periphery of said upright supports, and with said second channel being received between said first and third channels and spanning said central portion of said first and third channels.

11. The relay rack as defined in claim 10 wherein said flange of said second channel abuts said central portions of said first and third channel.

12. The relay rack as defined in claim 10 further comprising a crossbar having a central portion, two flanges, and end portions perpendicular to said flanges and perpendicular to said central portions such that said end portions and said flanges abut said ends of said uprights.

* * * * *